(12) United States Patent
Ikuta et al.

(10) Patent No.: US 6,961,245 B2
(45) Date of Patent: Nov. 1, 2005

(54) HIGH FREQUENCY MODULE

(75) Inventors: Takanori Ikuta, Kokubu (JP); Kenji Kitazawa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/059,256

(22) Filed: Feb. 15, 2005

(65) Prior Publication Data

US 2005/0146854 A1    Jul. 7, 2005

Related U.S. Application Data

(62) Division of application No. 10/371,997, filed on Feb. 21, 2003, now Pat. No. 6,873,529.

(30) Foreign Application Priority Data

Feb. 26, 2002 (JP) .............................. 2002-50251
Apr. 23, 2002 (JP) ............................. 2002-120812

(51) Int. Cl.⁷ ........................... H05K 3/42; H05K 7/20
(52) U.S. Cl. ..................... 361/719; 361/707; 361/704; 257/713
(58) Field of Search ............................ 361/704, 705, 361/707, 709, 711, 715–722; 257/705, 706, 257/707, 713, 717–719

(56) References Cited

U.S. PATENT DOCUMENTS

| | | | |
|---|---|---|---|
| 4,739,448 A * | 4/1988 | Rowe et al. ............... | 361/719 |
| 5,325,072 A | 6/1994 | Kohjiro et al. ............ | 330/286 |
| 5,640,048 A * | 6/1997 | Selna ....................... | 257/738 |
| 6,038,133 A * | 3/2000 | Nakatani et al. ........... | 361/760 |
| 6,057,600 A | 5/2000 | Kitazawa et al. .......... | 257/728 |
| 6,350,952 B1 * | 2/2002 | Gaku et al. ............... | 174/52.2 |
| 6,384,344 B1 * | 5/2002 | Asai et al. ................ | 174/261 |
| 6,487,085 B1 * | 11/2002 | Kimura et al. ............. | 361/763 |
| 6,538,210 B2 | 3/2003 | Sugaya et al. ............. | 174/258 |
| 6,633,005 B2 * | 10/2003 | Ichitsubo et al. .......... | 174/260 |
| 6,657,523 B2 * | 12/2003 | Tarui et al. ............... | 333/246 |
| 6,678,169 B2 * | 1/2004 | Ninomiya .................. | 361/780 |
| 6,683,512 B2 | 1/2004 | Nakamata et al. ......... | 333/126 |
| 6,714,422 B2 | 3/2004 | Ogawa et al. ............. | 361/793 |
| 6,797,890 B2 * | 9/2004 | Okubora et al. ........... | 174/260 |
| 6,800,936 B2 * | 10/2004 | Kosemura et al. ......... | 257/748 |
| 6,847,275 B2 * | 1/2005 | Sayanagi et al. .......... | 333/247 |
| 2001/0043130 A1 | 11/2001 | Nagamori et al. ......... | 333/116 |
| 2002/0075106 A1 | 6/2002 | Okubora et al. .......... | 333/247 |
| 2002/0171157 A1 | 11/2002 | Soga et al. ................ | 257/783 |
| 2003/0036020 A1 | 2/2003 | Kubota ..................... | 430/313 |

(Continued)

FOREIGN PATENT DOCUMENTS

JP       2004297456 A   * 10/2004   ............ H04B 1/40

*Primary Examiner*—Anatoly Vortman
(74) *Attorney, Agent, or Firm*—Hogan & Hartson LLP

(57) ABSTRACT

There is presented a high frequency module, in which a recess 2a for mounting power amplifier device is formed on a lower surface of a dielectric substrate 2, and a recess 2b for mounting surface acoustic wave filter is formed on an upper surface of the dielectric substrate 2, and a power amplifier device 4 and a surface acoustic wave filter 8 are mounted through conductive bumps 3a and 3b on the recesses 2a and 2b, respectively. In addition, a through-hole conductor 11 whose one end is exposed at the lower surface of the dielectric substrate 2 is provided between the recesses 2a and 2b. The exposed end of the through-hole conductor 11 is attached to a thermal dissipation conductor 15 on an upper surface of an external electric circuit board 7 through a brazing material 13.

12 Claims, 7 Drawing Sheets

U.S. PATENT DOCUMENTS

2003/0080836 A1    5/2003  Nagaishi et al. ............ 333/247
2003/0141105 A1    7/2003  Sugaya et al. .............. 174/256
2005/0056931 A1 *  3/2005  Ogawa ....................... 257/728

* cited by examiner

HIGH FREQUENCY MODULE

This is a divisional of application Ser. No. 10/371,997 filed Feb. 21, 2003, now U.S. Pat. No. 6,873,529 which application is hereby incorporated by reference in its entirety.

This application is based on applications No. 2002-50251 and No. 2002-120812 filed in Japan, the content of which is incorporated hereinto by reference.

BACKGROUND OF THE INVENTION

1. Field of the Invention

The present invention relates to a high frequency module used for electronic apparatuses and electronic devices including portable information terminals, wireless LANs, WLLs (Wireless Local Loop). In particular, this invention relates to a small size, high performance, low cost high-frequency module with a unitary structure incorporating a high frequency amplification device together with a high frequency filter or a high frequency splitter.

2. Description of the Related Art

A high frequency module generally includes inside a high frequency power amplifier device, and a high frequency filter or a high frequency splitter disposed in the vicinity of the power amplifier device.

With the recent increase in transmission capacity and transmission speed in mobile communication systems, the quantities of heat radiated by the high frequency power amplifier devices have been increasing to deal with the great deal of high frequency energy.

However, such high frequency filters and high frequency splitters are susceptive to heat. Specifically, surface acoustic wave filter used for the high frequency filter or the high frequency splitter is a device generally including a piezoelectric substrate made of lithium tantalite or the like formed with a comb-shaped electrode for propagating surface acoustic waves. Since the electric properties of the piezoelectric substrate itself are greatly influenced by temperature changes, it needs to be disposed apart from the heating element such as the high frequency power amplifier device provided inside the module. In addition, this problem is not only with SAW (Surface Acoustic Wave) devices but also with FBARs (Film Bulk Acoustic Resonator) and BAWs (Bulk Acoustic Wave Filter). These thermally unstable devices are hereinafter collectively referred to as "filter component".

For this reason, conventional high frequency modules with a unitary structure incorporating the high frequency power amplifier device, the high frequency filter or the like are unable to sufficiently meet the recent demand for miniaturization, lightening, high density packaging, and cost reduction of mobile communication terminals and the like.

BRIEF SUMMARY OF THE INVENTION

A primary object of the present invention is to provide a small size, high performance, low cost high frequency module capable of keeping the filter component free from the influence of heat radiated by the power amplifier device with high power that is located in the vicinity thereof, and maintaining the high frequency filtering characteristics of the filter component.

(1) In a high frequency module according to the present invention, a recess for mounting power amplifier device is formed on a first surface of a dielectric substrate comprising a plurality of dielectric layers that are laminated together, and a recess for mounting filter component is formed on the first surface or a second surface of the dielectric substrate, and a power amplifier device and a filter component are mounted on the respective recesses. At least at the recess for mounting power amplifier device, a thermal transfer seal component is attached in contact with the power amplifier device. A through-hole conductor whose one end is exposed at the first surface of the dielectric substrate is provided between the recess for mounting power amplifier device and the recess for mounting filter component. The thermal transfer seal component and the through-hole conductor are attached to a thermal dissipation conductor on an upper surface of an external electric circuit board through a brazing material.

In the above-described structure of the present invention, heat radiated by the power amplifier device is allowed to be efficiently dissipated through the thermal transfer seal component that is joined directly to the power amplifier device and the brazing material to the thermal dissipation conductor on the upper surface of the external electric circuit board. In addition, heat propagation from the power amplifier device to the filter component disposed in the vicinity thereof is shielded by the through-hole conductor, and the heat is propagated through the through-hole conductor and the brazing material to the thermal dissipation conductor on the upper surface of the external electric circuit board. Accordingly, heat propagation to the filter component can be significantly reduced. As a result, a small size, high performance high frequency module can be provided without deteriorating the electric properties such as high frequency filtering characteristics of the filter component. In addition, since additional heat dissipation members such as heat dissipating fins are not required, the high frequency module can be a low cost high frequency module suitable for electronic apparatuses and electronic devices including portable information terminals.

Additionally, while the power amplifier device is mounted on the recess that is formed on the side of the surface on which the dielectric substrate is mounted, the filter component may be provided on either surface of the dielectric substrate. When the power amplifier device and the filter component are mounted on the same surface, the number of the processes is reduced, so that the high frequency module can be more inexpensive.

In order to further reduce the influence of heat radiated by the power amplifier device on the filter component in the high frequency module described above, the thermal conductivity of the dielectric layers is preferably 20 W/m·K or less. In addition, it is preferred that a portion of the dielectric layers that is located around the recess for mounting power amplifier device comprises a dielectric layer having a thermal conductivity smaller than the thermal conductivity of a portion of the dielectric layers that is located around the recess for mounting filter component. Furthermore, it is preferred that the recess for mounting power amplifier device and the recess for mounting filter component are spaced apart at a distance of 0.3 mm or more, that there are a plurality of the through-hole conductors formed between the recess for mounting power amplifier device and the recess for mounting filter component, and that a conductor layer that is connected to the power amplifier device and a conductor layer that is connected to the filter component are each formed on a different dielectric layer.

By the improvements recited above, it is possible to provide a small size, high performance high frequency module without deteriorating the electric properties such as the high frequency filtering characteristics of the filter component and the high frequency splitting characteristics of the high frequency splitter.

Incidentally, the recess for mounting filter component may be sealed with a cover component or filled with an insulative resin.

(2) In another high frequency module according to the present invention, a power amplifier device and a filter component are mounted on a power amplifier device mounting portion and a filter component mounting portion, respectively, on a first surface of a dielectric substrate comprising a plurality of dielectric layers that are laminated together, a first through-hole conductor which penetrates through the dielectric substrate to a second surface thereof is formed under the power amplifier device mounting portion, and a second through-hole conductor whose one end is exposed at the second surface is formed between the power amplifier device mounting portion and the filter component mounting portion. Lower ends of the first through-hole conductor and the second through-hole conductor are attached to a thermal dissipation conductor on an upper surface of an external electric circuit board through a brazing material.

In the above-described structure according to the present invention, heat radiated by the power amplifier device is allowed to be efficiently dissipated through the first through-hole conductor formed under the power amplifier device mounting portion and the brazing material to the thermal dissipation conductor on the upper surface of the external electric circuit board. In addition, heat propagation from the power amplifier device to the filter component disposed in the vicinity thereof is shielded by the second through-hole conductor. Accordingly, the heat propagation to the surface acoustic wave filter can be significantly reduced. As a result, a small size, high performance high frequency module can be provided without deteriorating the electric properties such as high frequency filtering characteristics of the filter component and the characteristics of the high frequency splitter. In addition, since additional heat dissipation members such as heat dissipating fins are not required in such a high frequency module, miniaturization can be accomplished. Accordingly, a low cost high frequency module that is suitable for electronic apparatuses and electronic devices including portable information terminals can be provided.

Incidentally, it is preferred in terms of improving the reliability that the recess for mounting power amplifier device and/or the recess for mounting filter component is formed on the first surface of the dielectric substrate comprising a plurality of dielectric layers laminated together, and the power amplifier device and/or the filter component is sealed within the recess by means of a cover component or an insulative resin.

In addition, by providing a third through-hole conductor which penetrates through the dielectric substrate to the second surface under the filter component mounting portion that is formed on the first surface of the dielectric substrate comprising a plurality of dielectric layers laminated together, the influence of heat on the filter component can be further reduced.

Furthermore, by the features in that: the thermal conductivity of the dielectric layers is 20 W/m·K or less; a portion of the dielectric layers that is located around the power amplifier device mounting portion comprises a dielectric layer having a thermal conductivity smaller than the thermal conductivity of a portion of the dielectric layers located around the filter component mounting portion; the power amplifier device mounting portion and the filter component mounting portion are spaced apart at a distance of 0.8 mm or more; and a conductor layer that is connected to the filter component and a conductor layer that is connected to the power amplifier device are each formed on a different dielectric layer, it is possible to provide a further downsized, higher performance high frequency module without deteriorating the electric properties such as high frequency filtering characteristics of the filter component and the characteristics of the high frequency splitter.

The present invention is hereinafter described more in detail with reference to the appended drawings.

DETAILED DESCRIPTION OF THE INVENTION

The high frequency module according to the present invention is hereinafter described in detail referring to the accompanying drawings.

First Embodiment

Figure 1:
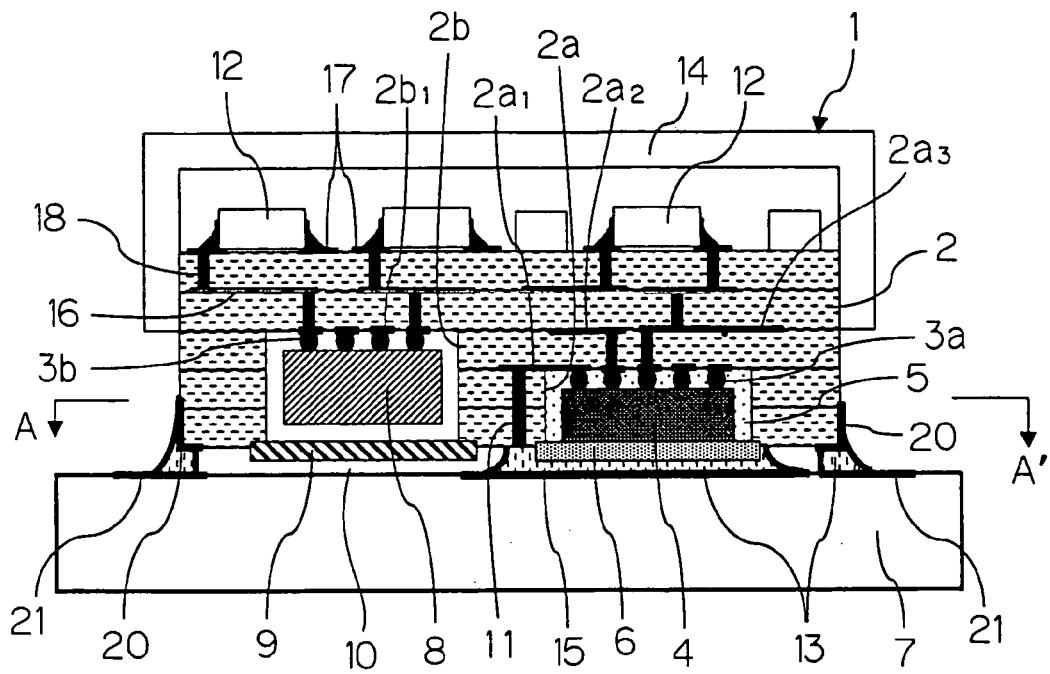
FIG. 1 is a schematic cross-sectional view showing a high frequency module according to a first embodiment of the present invention.

FIG. 1 is a cross-sectional view of a high frequency module according to a first embodiment this invention, in which a high frequency module 1 is mounted on an external electric circuit board 7 such as a motherboard.

The high frequency module 1 has a dielectric substrate 2 comprising a plurality of dielectric layers laminated together. For the dielectric layers, low temperature fireable ceramics such as alumina ceramics, mullite ceramics, and glass ceramics, or mixtures of organic resin material and ceramic material can be used. In particular, in cases where Cu or Ag is used for the conductors and cofiring is performed for the fabrication, a low temperature fireable ceramic such as glass ceramic, or a mixture of organic resin material and ceramic material is preferably used. Low temperature fireable ceramics such as glass ceramics are most preferable for this purpose because of their superior thermal stability.

The thermal conductivity of the dielectric layers constituting the dielectric substrate 2 can be controlled by the selection of the ceramic materials and controlling the mixing ratio, and it is preferably 20 W/m·K or less, more preferably 10 W/m·K or less, further preferably 5 W/m·K or less, or most preferably 3 W/m·K or less.

In the high frequency module 1 shown in FIG. 1, a recess 2a for mounting power amplifier device 4 and a recess 2b for mounting surface acoustic wave filter are formed on the lower surface of the dielectric substrate 2 being spaced apart at a predetermined distance.

At the bottom face of the recess 2a (although it is the upper face of the recess in the drawing, hereinafter referred to as the "bottom face") for mounting power amplifier device, a conductor layer 2a1 is formed, and an electrode of the power amplifier device is electrically connected thereto through conductive bumps 3a. For the conductive bumps 3a, gold, solder, thermosetting Ag paste or the like may be used. When, for example, gold is used, electrical connection between the electrode of the power amplifier device 4 and the conductor layer 2a1 can be accomplished by ultrasonic thermocompression bonding. The use of gold allows the connection resistance and conductor losses to be less than when solder or thermosetting Ag paste is used.

For the power amplifier device 4, a transistor such as a PN junction gate field effect transistor, a Schottky barrier gate field effect transistor, a heterojunction field effect transistor, a PN-junction gate heterojunction field effect transistor or the like is used.

A so-called underfill resin 5 is injected between the power amplifier device 4 and the conductor layer 2a1 for the purpose of protecting the connection areas and the device surfaces. For the underfill resin 5, a resin that is hardened by application of heat such as epoxy resin, silicone resin or the like may be used. In the high frequency module 1 according to the present invention, the thermal conductivity of the underfill resin 5 is preferably 20 W/m·K or less, or more preferably, an epoxy resin underfill whose thermal conductivity is about 10 W/m·K or less is used. It is thus possible to prevent heat radiated by the power amplifier device 4 from being propagated to the dielectric substrate 2 itself.

At the lower aperture of the recess 2a for mounting power amplifier device, a thermal transfer seal component 6 is attached directly to the bottom face of the power amplifier device 4 or brought in contact therewith through a heat transfer compound such as heat sink grease. The thermal transfer seal component 6 is provided for efficiently propagating heat radiated by the power amplifier device 4 to the external electric circuit board 7, and specifically, it is made of a metal, which is preferably a metal with high thermal conductivity such as copper.

This thermal transfer seal component 6 is attached to a thermal dissipation conductor 15, which is formed on the upper surface of the external electric circuit board 7, through a brazing material 13. Thus, heat radiated by the power amplifier device 4 is efficiently propagated through the thermal transfer seal component 6 and the brazing material 13 to the thermal dissipation conductor 15 formed on the upper surface of the external electric circuit board 7, so that the heat radiated by the power amplifier device 4 is prevented from reaching the surface acoustic wave filter 8 inside the module.

Incidentally, in order to obtain good brazability between the thermal transfer seal component 6 attached to the bottom face of the power amplifier device 4 and the thermal dissipation conductor 15 on the upper surface of the external electric circuit board 7 and a ground electrode (not shown), a surface of the thermal transfer seal component 6 is preferably plated with Ni, Si, solder or the like.

Meanwhile, at the recess 2b for mounting acoustic substrate wave device, the surface acoustic wave filter 8 is mounted and electrically connected to an electrode portion comprising the conductor layer 2b formed on the bottom face of the recess 2b for mounting surface acoustic wave filter via the conductive bumps 3b. For the conductive bumps 3b, as in the case of the conductive bumps 3a, gold, solder, thermosetting Ag paste or the like may be used. When, for example, gold is used, electrical connection between the electrode of the surface acoustic wave filter 8 and the conductor layer 2b1 can be accomplished by the ultrasonic thermocompression bonding method.

For the surface acoustic wave filter 8, a resonator-type filter, a ladder-type or lattice-type coupled resonator filter, a multi-IDT (Inter Digital Transducer) filter or the like is employed. When the surface acoustic wave filter 8 is a resonator filter, a 36 degree rotated Y-cut X-propagation LiTaO$_3$ crystal, a 64 degree rotated Y-cut X-propagation liNbO$_3$ crystal, or a 45 degree rotated X-cut Z-propagation LiB$_4$O$_7$ crystal is advantageously employed for the piezoelectric substrate because of their high electromechanical coupling coefficients and low thermal coefficients for group delay time. In addition, in order to excite, propagate and resonate surface acoustic waves on the surface of the piezoelectric substrate, an IDT (Inter Digital Transducer) electrode (not shown) comprising at least a couple of comb-shaped electrodes that are formed so as to engage with each other is provided on the surface of the piezoelectric substrate. The IDT electrode is constructed by connecting plural pairs of comb-shaped electrodes in series or in parallel so as to obtain desired filtering characteristics. Such an IDT electrode can be formed on the piezoelectric substrate into a desired configuration with a desired size by a thin-film forming method such as vapor deposition, sputtering, or the CVD method.

In the high frequency module in FIG. 1, a cover component 9 is attached to the lower aperture of the recess 2b for mounting surface acoustic wave filter being spaced apart from the surface acoustic wave filter 8. For the purposes of mechanically protecting the surface acoustic wave filter 8 and suppressing deterioration of the IDT electrode due to oxidization, air with low humidity or the like is encapsulated within the inner space, which is the vibration space, of the recess 2b for mounting surface acoustic wave filter. The cover component 9 is attached by means of an epoxy resin, brazing material or the like so as to seal the recess 2b for mounting surface acoustic wave filter.

Alternatively, an inert gas such as nitrogen gas or argon gas, or an inert gas with lower thermal conductivity than that of air may be encapsulated within the recess, so that deterioration of the IDT electrode due to oxidization can also be prevented.

The material used for the cover component 9 may be a metal such as SUS, copper, nickel silver or the like, or a resin such as glass epoxy resin. Since heat radiated by the power amplifier device 4 is propagated to the external electric circuit board 7 through the thermal transfer seal component 6, in particular, glass epoxy resin with low thermal conductivity is preferably used for the cover component 9 so that the heat propagated to the external electric circuit board 7 is not propagated again to the surface acoustic wave filter 8 through the cover component 9.

The cover component 9 is mounted on the recess 2b for mounting surface acoustic wave filter being spaced apart from the surface acoustic wave filter 8. Additionally, a space portion 10 is provided between the cover component 9 and the external electric circuit board 7, by which it is further ensured that heat propagation from the power amplifier device 4 to the surface acoustic wave filter 8 can be suppressed.

While the aperture of the recess 2b for mounting surface acoustic wave filter is sealed with the cover component 9 in the embodiment in FIG. 1, it is also possible to seal the aperture by injecting a resin sealant such as a silicone resin, an epoxy resin or the like into the recess 2b.

The recess 2a for mounting power amplifier device and the recess 2b for mounting surface acoustic wave filter are preferably spaced at a distance of 0.3 mm or more, and more preferably, they are spaced at a distance of 0.5 mm or more. This makes it possible to sufficiently reduce the heat propagation from the power amplifier device 4 to the surface acoustic wave filter 8 through dielectric layers between the recesses 2a and 2b.

In addition, in the present invention, the through-hole conductor 11 is formed between the recess 2a for mounting amplification device and the recess 2b for mounting surface acoustic wave filter, and one end of the through-hole conductor 11 is exposed at the lower surface. This through-hole conductor 11 is, similarly to the thermal transfer seal component 6, also connected to the thermal dissipation conductor 15 on the upper surface of the external electric circuit board 7 through the brazing material 13.

Or, together with or instead of the arrangement in which the through-hole conductor 11 is connected to an extending portion of the conductor layer 2a1, the through-hole conductor 11 may be connected to an extending portion of a conductor layer (denoted by 2a2, 2a3 in FIG. 1) that is formed in a dielectric layer located further above the conductor layer 2a1 and connected to the electrode of the power amplifier device 4.

By the formation of such a through-hole conductor 11, a part of the heat radiated by the power amplifier device 4 which is propagated to the conductor layer 2a1 at the bottom face of the recess 2a, or to the conductor layer 2a2 or 2a3, and a part of the heat radiated by the power amplifier device 4 which is propagated to dielectric layers between the both recesses 2a and 2b are absorbed by the through-hole conductor 11 so as to be efficiently propagated to the thermal dissipation conductor 15 formed on the upper surface of the external electric circuit board 7 through the brazing material 13.

The aforementioned effect can be further enhanced by providing, instead of only one, two or more such through-hole conductors 11 between the recess 2a for mounting power amplifier device and the recess 2b for mounting surface acoustic wave filter.

Figure 2:
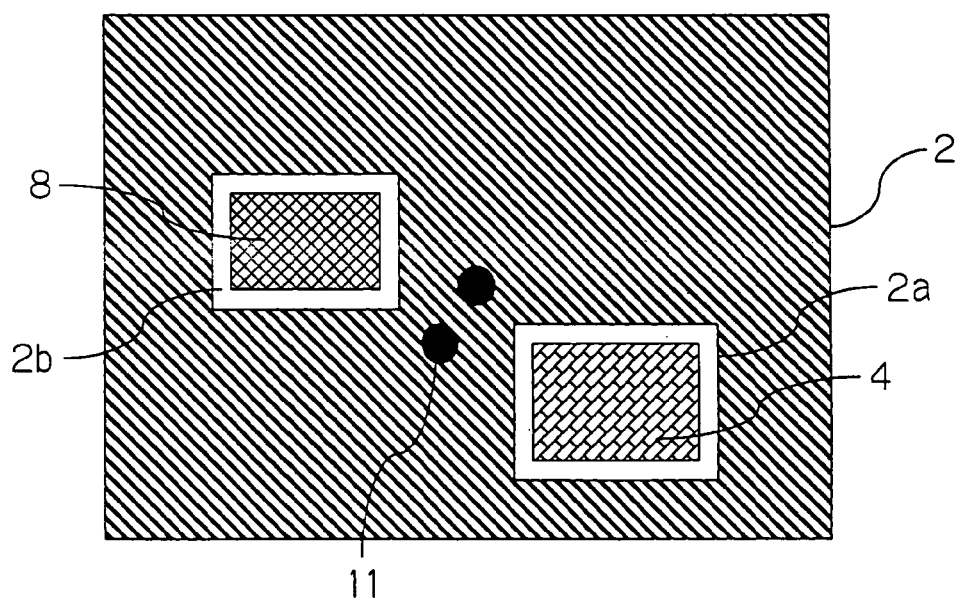
FIG. 2 is a schematic plan view taken along the line A–A' in FIG. 1, illustrating an example of the arrangement of through-hole conductors in a high frequency module according to the invention.
Figure 3:
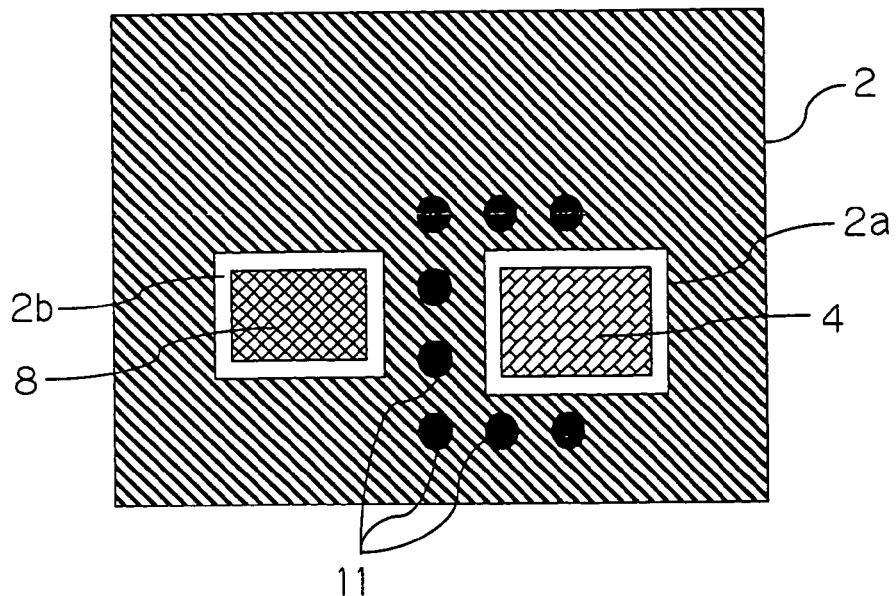
FIG. 3 is a schematic plan view showing another example of the arrangement of through-hole conductors in a high frequency module according to the invention.
Figure 4:
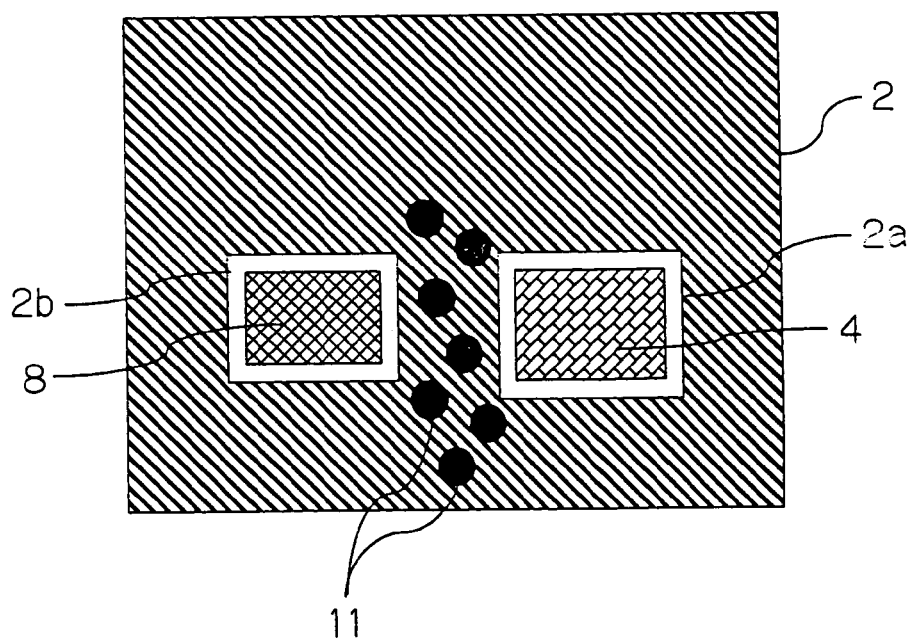
FIG. 4 is a schematic plan view showing still another example of the arrangement of through-hole conductors in a high frequency module according to the invention.

Specific examples of the arrangement of the recess 2a for mounting power amplifier device, the recess 2b for mounting surface acoustic wave filter and the through-hole conductor 11 are shown in FIGS. 2–4. FIG. 2 shows a plan view of the high frequency module in FIG. 1, which is taken along the line A–A' in FIG. 1. FIGS. 3 and 4 are plan views of other examples of the arrangement.

In FIG. 2, two through-hole conductors 11 are formed at an approximate middle area between the recess 2a for mounting power amplifier device and the recess 2b for mounting surface acoustic wave filter that are diagonally arranged when viewed two-dimensionally. In FIG. 3, the arrangement is such that a plurality of through-hole conductors 11 are linearly arranged so as to partially enclose the recess 2a for mounting power amplifier device at an approximate middle area between the recess 2a and the recess 2b for mounting surface acoustic wave filter that are laterally juxtaposed to each other. FIG. 4 shows an arrangement in which a plurality of through-hole conductors 11 are arranged in a so-called zigzag fashion at an approximate middle area between the recess 2a for mounting power amplifier device and the recess 2b for mounting surface acoustic wave filter that are laterally juxtaposed to each other.

To accomplish the function, the through-hole conductor 11 is preferably formed of metal with superior thermal conductivity, and in particular, it preferably comprises a conductor mainly composed of metal, which comprises at least one material selected from the group consisting of Cu, CuO, Ag, Ag—Pd, Ag—Pt and Au. In particular, in order to make it harder for heat radiated by the power amplifier device 4 to be propagated to the dielectric substrate 2 and further to the surface acoustic wave filter 8, the thermal conductivity of the through-hole conductor 11 is preferably more than five times as large as the thermal conductivity of the dielectric substrate 2, and more preferably, it is 100 W/m·K or more. Furthermore, the through-hole conductor 11 may include inorganic material such as metal oxide and glass so as to afford control of the shrinkage upon firing with the dielectric substrate.

Such a high thermal conductivity of the through-hole conductor 11 can be realized, for example, as a thermal conductivity of 150 W/m·K, by blending about 85% by mass of Ag powder, 3% by mass of lead borosilicate glass, and 12% by mass of $SiO_2$.

Although the diameter of the through-hole conductor 11 is not uniform, it is preferred that the diameter of the narrowest part of the through-hole conductor 11 is from 0.1 to 0.5 mm. When a plurality of through-hole conductors 11 are formed, the through-hole conductors 11 may be disposed such that their respective lateral surfaces are spaced at intervals of 0.2–1.0 mm. In addition, the cross-cross-sectional profile of the through-hole conductor 11 is not necessarily circular, but may be of an elliptic or slit-like (rectangular) shape.

In the high frequency module 1 according to the present invention, as shown in FIG. 1, the recesses 2a, 2b are each formed at a different depth so that the conductor layers 2a1 and 2b1, which are formed in the dielectric substrate 2 at the bottom face of the recess 2a for mounting power amplifier device and the bottom face of the recess 2b for mounting surface acoustic wave filter, respectively, are each formed on a different dielectric layer. Thus, the quantity of heat propagated from the power amplifier device 4 to the surface acoustic wave filter 8 through the dielectric layers and conductor layers can be more effectively reduced as compared with cases where such conductive layers 2a1 and 2b1 are formed on the same dielectric layer. Accordingly, it is possible to further ensure that the electric properties are prevented from deteriorating as a result of the thermal influence on the surface acoustic wave filter.

In the high frequency module 1 according to this invention, as shown in FIG. 1, the power amplifier device 4 and the surface acoustic wave filter 8 are connected to electronic components 12 including resistor, capacitor, inductor, semiconductor device and the like mounted on the upper surface of the dielectric substrate 2 via an internal conductor wiring 16, surface conductor wiring 17 and a via-hole conductor 18. By this arrangement, the power amplifier device 4 and the surface acoustic wave filter 8 are adapted to serve the respective functions, thereby accomplishing a desired electronic circuit. Also according to the need, a high frequency filter (not shown) or the like comprising capacitor, inductor and the like may be incorporated within the dielectric substrate 2 by utilizing conductor wiring, by which a further down-sized high frequency module 1 with further improved functions can be realized.

In addition, by mounting a metal shield case 14 for the purpose of protecting the electronic components 12 and the circuits mounted on the surface of the high frequency module 1, it is possible to shield or suppress mechanical stress from the outside, atmospheric influences, and electromagnetic noises.

Furthermore, in this high frequency module 1, electrode pads 20 for signal transmission formed in the high frequency module 1 are connected to a signal wiring layer 21 formed on the upper surface of the external electric circuit board 7 through the brazing material 13.

Figure 5:
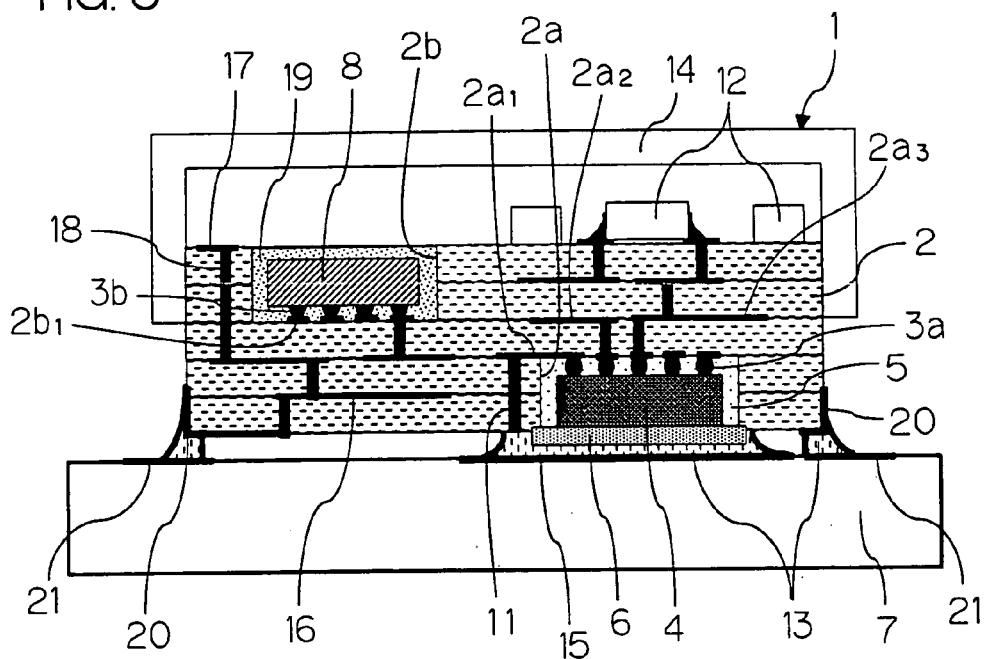
FIG. 5 is a schematic cross-sectional view showing another high frequency module according to the first embodiment of the present invention.

FIG. 5 is a cross-cross-sectional view of another example of the high frequency module according to this invention. While in the embodiment shown in FIG. 1 the recess 2b for mounting surface acoustic wave filter is formed on the same surface as the recess 2a for mounting power amplifier device, the recess 2b is formed on the opposite side, i.e., on the upper surface side in this FIG. 5. The surface acoustic wave filter 8 is connected to a conductor layer 2b1 formed within the recess 2b as in FIG. 1. In this example, an insulative organic resin 19 is injected into the recess 2b, thereby the surface acoustic wave filter 8 is sealed with resin.

Also, in this example, a through-hole conductor 11 is disposed at an approximate middle area between the recess 2 b for mounting surface acoustic wave filter and recess 2a for mounting power amplifier device as in FIG. 1. Here, one end of the through-hole conductor 11 is exposed at the lower surface of the module 1 and brazed onto a thermal dissipation conductor 15 through a brazing material 13 and another end thereof is connected to an extending portion of a conductor layer 2a1 as in FIG. 1. The through-hole conductor 1 may be connected to an extending portion of the conductor layer 2a2 or 2a3 that is superposed on the layer 2a1.

Figure 6:
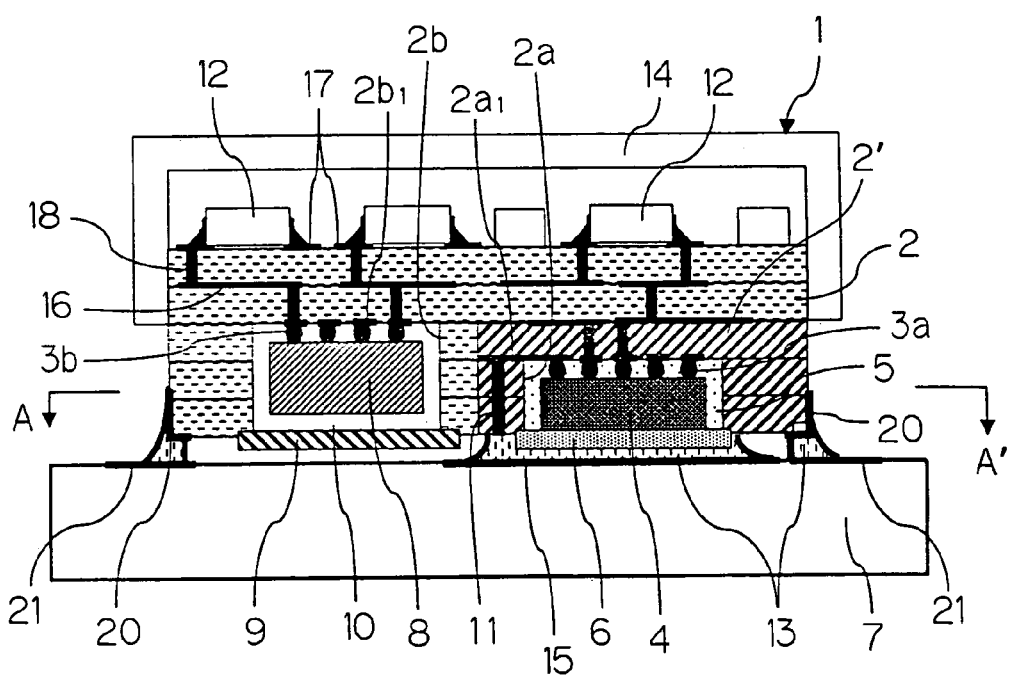
FIG. 6 is a schematic cross-sectional view showing still another high frequency module according to the first embodiment of the present invention.

FIG. 6 is a schematic cross-cross-sectional view showing still another high frequency module according to the first embodiment of the present invention. While the dielectric substrate 2 is formed uniformly of the same material in the embodiments of FIGS. 1 and 5, in the example of FIG. 6, a portion of the dielectric substrate that is located around the recess 2a for mounting power amplifier device is formed of a dielectric material 2' which has a lower thermal conductivity than the material for the other portion. By this feature, the dielectric material 2' functions as a heat insulator, and thereby heat radiated by the power amplifier device 4 can be prevented from being diffused or propagated around the device.

Figure 7:
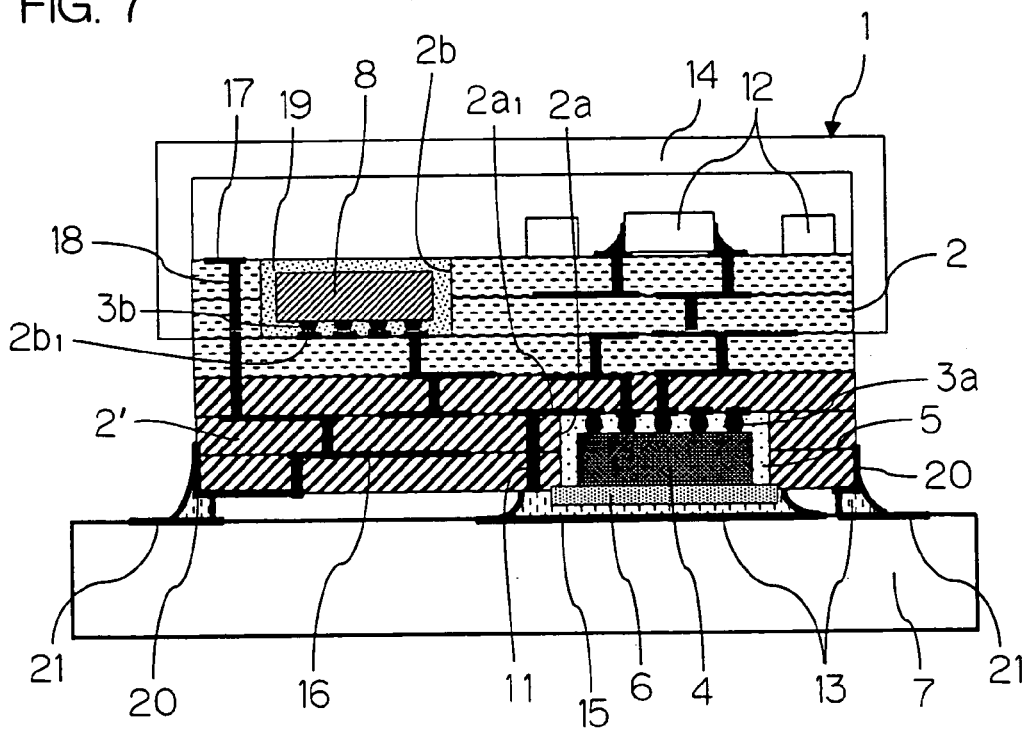
FIG. 7 is a schematic cross-sectional view showing yet another high frequency module according to the first embodiment of the present invention.

FIG. 7 is a schematic cross-sectional view showing yet another high frequency module according to the first embodiment of the invention. In the embodiment of FIG. 6, two different dielectric materials are separately present within the same dielectric layers. In the embodiment of FIG. 7, the recess 2 a for mounting power amplifier device is formed on the lower surface side of the substrate and the recess 2b for mounting surface acoustic wave filter is formed on the upper surface side thereof as in FIG. 5, while the portion on the lower side is formed entirely of material 2' with the lower thermal conductivity.

Now, a description is given of a method for fabricating the high frequency module according to the invention. An example where the dielectric substrate comprises a glass-ceramic composition is discussed below as a preferred embodiment.

First, to form dielectric layers constituting the dielectric substrate 2, ceramic green sheets composed of a glass-ceramic composition are fabricated. The ceramic green sheets for the dielectric layers are fabricated as follows: 30–90% by mass of a commonly known glass material such as borosilicate glass, zinc borosilicate-based glass, or $SiO_2$—$Al_2O_3$-alkaline earth oxide glass is mixed with 10–70% by mass of an inorganic filler such as alumina, quartz, mullite, AlN, or forsterite. Then, an organic binder such as alkyl methacrylate, a plasticizer such as DBP (dibutyl phthalate) and an organic solvent such as toluene are added to the mixture. The whole mixture is kneaded together in a ball mill for 4–8 hours to produce a slurry. By using the slurry, tape casting is performed by the doctor blade method or the like to produce a tape, and the tape is cut into sheets with a desired size, thereby ceramic green sheets are fabricated.

Subsequently, prescribed ceramic green sheets are formed with through-holes for the through-hole conductors 11, a through-hole for the via-hole conductor 18 for connecting the inner conductor wiring 16 and the surface conductor wiring 17, a recess 2a for mounting power amplifier device, and a recess 2b for mounting surface acoustic wave filter. In carrying out this process, the holes are formed by micro drilling and/or punching, and the recesses are formed by subjecting green sheets containing a photosensitive resin to a light exposure and development process. It is also possible to form through-holes with various shapes including circular, elliptic, and elongated shapes by such an exposure and development procedure.

In addition, the through-holes for through-hole conductors 11 and the through-hole for the via-hole conductor 18 are filled with Cu or Ag-based conductive paste. Simultaneously, green sheets are each formed with patterns that are to serve as the inner conductor wiring 16, the surface conductor wiring 17, the conductor layer 2a1 and the conductor layer 2b1, using Cu or Ag-based conductive paste by screen printing, gravure printing or the like.

For the Cu or Ag-based conductive paste, in addition to powders such as Cu powder, CuO powder and Ag powder, Ag alloy powders such as Ag—Pd powder and Ag—Pt powder may be employed. According to the need, predetermined amounts of a borosilicate-based low/melting-point glass, $SiO_2$, $Al_2O_3$, an alkaline earth metal oxide such as MgO or CaO, and a metal oxide such as $Bi_2O_3$, an organic binder such as ethyl cellulose and an organic solvent such as 2,2,4-trimethyl-1,3-pentanediol monoisobutyrate are mixed with the metal powder and homogeneously kneaded together to be used as the material.

In cases where, according to the need, predetermined amounts of a borosilicate-based loW/melting-point glass such as zinc borosilicate glass or lead borosilicate glass, inorganic material such as metal oxide, for example, $Al_2O_3$, MgO, CaO, or $Bi_2O_3$, an organic binder such as ethyl cellulose and an organic solvent such as 2,2,4-trimethyl-1,3-pentanediol monoisobutyrate are mixed with the metal powder and homogeneously kneaded together to be used as the material, the thermal conductivity can be controlled by adjusting the ratio of the loW/melting-point glass and metal oxide to the metal powder.

The ceramic green sheets obtained in the above described manner are positioned, for example, by using the via-hole conductor 18 as the reference, stacked according to a lamination sequence and laminated together under heat and pressure, thereby an unfired multilayer body is produced.

Subsequently, this unfired multilayer body is fired, for example, in an oxidizing atmosphere so as to be sinter-bonded together. Specifically, such a sintered substrate can be obtained by firing the multilayer body in an oxygen atmosphere or in atmospheric air at a temperature of 800–1000.degree. C.

Thereafter, the power amplifier device 4, the surface acoustic wave filter 8 and the like are mounted on the recesses 2a, 2b, and then sealed by attaching the thermal transfer seal component 6 and/or the cover component 9 to the mounting portions by brazing or by injection of the organic resin sealant 19.

When such a module is mounted on the external electric circuit board 7, it is attached to the external electric board by brazing the electrode pads 20 for signal transmission of the module onto the external electric circuit board 7, and simultaneously, by brazing the thermal transfer seal component 6 and the through-hole conductors 11 onto the thermal dissipation conductor 15 formed on the upper surface of the external electric circuit board.

When the portion around the recess 2a for mounting power amplifier device is formed by employing the heat insulative dielectric material 2' as shown in FIG. 6, the process may be such that a photosensitive resin is mixed with the material for the dielectric substrate 2, and after a prescribed recess is formed by exposure and development, the heat insulative dielectric material 2' is injected into the recess, and thereafter, the recesses 2a, 2b are formed by punching or the like, thereby fabricating an unfired multilayer body, which is then fired.

Or, when the module is formed by using dielectric materials with different thermal conductivities to constitute the upper portion and lower portion of the dielectric substrate 2 as in FIG. 7, the process may be such that green sheets are fabricated using dielectric materials suitable for the respective portions, and after being each processed, they are laminated into an unfired multilayer body, and then fired.

EXAMPLE

The present invention is hereinafter described in detail on the basis of the following example and comparative example.

A glass-ceramic dielectric material comprising a borosilicate glass and alumina and having a thermal conductivity of 3–5 W/m·K was used as the dielectric material. For the through-hole conductors, an Ag-based conductive material with a thermal conductivity of 150 W/m·K was used. Copper was used for the thermal transfer seal component. With the use of the materials above, a high frequency module was fabricated as previously described. This high frequency module was mounted using a Cu—Ag-based brazing material onto the surface of a motherboard having an insulating substrate that was composed of a glass woven cloth-epoxy resin composite material and having a thermal dissipation conductor and a wiring layer for signal transmission made of copper formed thereon.

TABLE 1

| Sample No. | Module structure | Thermal conductivity of dielectric substrate (W/m · K) | Space between recesses (mm) | Brazing with thermal transfer seal component | Number of through-hole conductors | Temperature of recess for PA device (° C.) | Temperature of recess for SAW device (° C.) |
| --- | --- | --- | --- | --- | --- | --- | --- |
| *1 | — | 5 | 0.5 | No | 0 | 110 | 75 |
| *2 | — | 5 | 0.5 | Yes | 0 | 80 | 58 |
| 3 | FIG. 1 | 5 | 0.5 | Yes | 2 | 78 | 50 |
| 4 | FIG. 1 | 3 | 0.5 | Yes | 2 | 80 | 45 |
| 5 | FIG. 1 | 3 | 0.5 | Yes | 5 | 80 | 40 |
| 6 | FIG. 3 | 3 | 0.5 | Yes | 8 | 79 | 32 |
| 7 | FIG. 5 | 5 | 0.5 | Yes | 2 | 80 | 43 |
| 8 | FIG. 6 | 5 (3 around PA) | 0.5 | Yes | 2 | 78 | 44 |
| 9 | FIG. 7 | 5 (3 PA side) | 0.5 | Yes | 2 | 79 | 38 |

*Not within the invention

The conditions were set up so that with the source ON/OFF ratio (Duty cycle) of the power amplifier device (PA) being ⅛, an output of 33.5 dBm be obtained from an input signal of 0 dB, and the steady temperatures inside the recess for power amplifier device and the recess for surface acoustic wave filter were measured.

In addition, by using a simulation program for thermal conduction analysis, temperatures at the recesses were calculated for the cases where the thermal conductivity of dielectric layers located around the power amplifier device was differed from that of the other portion. (Sample Nos. 8, 9).

As is apparent from the results in Table 1, the temperatures inside the recess for power amplifier device and the recess for surface acoustic wave filter are higher in the cases of samples Nos. 1, 2 where there are no thermal transfer seal components or through-hole conductors, than in the cases of samples Nos. 3–9 where there are the thermal transfer seal components and through-hole conductors.

It has been found that the structure according to the invention which includes the thermal transfer seal component and through-hole conductor allows heat of the power amplifier device to be effectively dissipated, thereby reducing the thermal influence on the surface acoustic wave filter.

It has been also understood that in such a structure, the effect is more remarkable as the number of the through-hole conductors increases and the thermal conductivity of the dielectric substrate decreases. Furthermore, results similar to those in the cases where the number of the through-hole conductors was increased were obtained for Samples Nos. 8, 9 where the dielectric substrate was formed using two kinds of dielectric materials.

Second Embodiment

Figure 8:
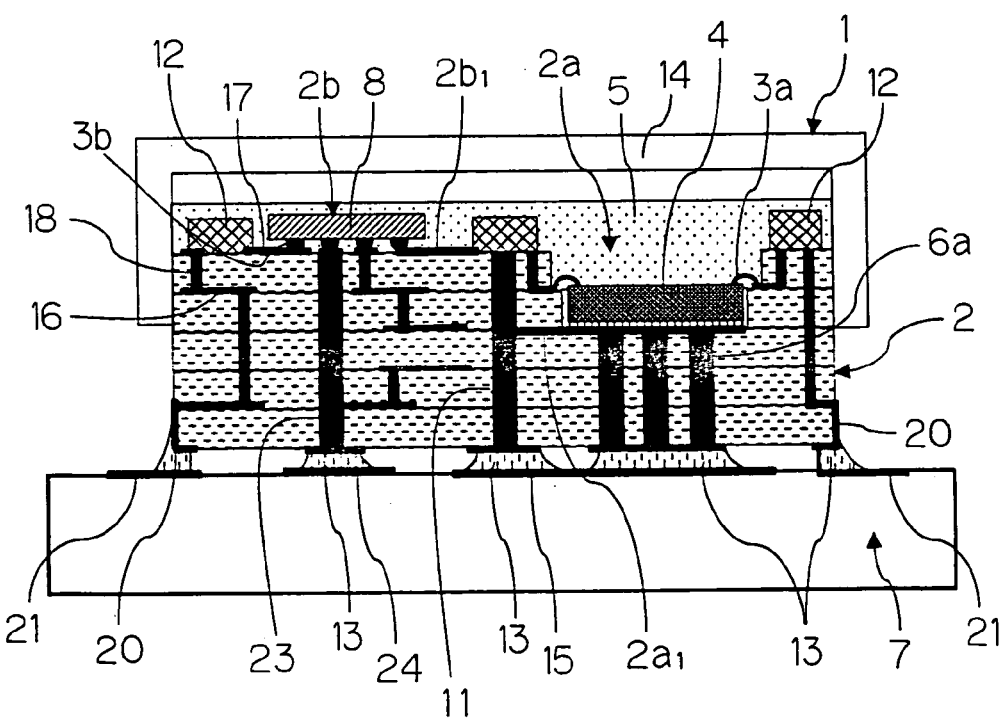
FIG. 8 is a schematic cross-sectional view showing a high frequency module according to a second embodiment of the present invention.

FIG. 8 is a cross-cross-sectional view showing a high frequency module according to the second embodiment of the invention. In this embodiment, the high frequency module 1 is mounted on an external electric circuit board 7 such as a motherboard and implemented therein.

A dielectric substrate 2 in the high frequency module 1 comprises a plurality of dielectric layers laminated together, and the same materials as described in the first embodiment may be used for this substrate.

The same as described in the first embodiment may also be applied to the thermal conductivity of the dielectric layers constituting the dielectric substrate 2.

In the high frequency module shown 1 in FIG. 8, a power amplifier device mounting portion 2a comprising a recess and a surface acoustic wave filter mounting portion 2b comprising a planar surface are formed being spaced apart a predetermined distance from each other on the upper surface of the dielectric substrate 2.

A conductor layer 2a1 is formed at a bottom face of the power amplifier device mounting portion 2a, and a power amplifier device 4 is mounted thereon. The power amplifier device 4 is electrically connected to an internal conductor wiring 16 through a wire bonding 3a.

The transistor device or the like constituting the power amplifier device 4 is of the same kind as described in the first embodiment.

An underfill resin 5 is injected over the power amplifier device 4 and between the power amplifier device 4 and the conductor layer 2a1 for the purpose of protecting the connection parts and device surfaces. The material for the underfill resin 5 is the same as described in FIG. 1, which makes it possible to suppress propagation of heat from the power amplifier device 4 to the dielectric substrate 2 itself.

Under the power amplifier device mounting portion 2a, there are formed first through-hole conductors 6a that penetrate through the dielectric substrate 2 to the lower surface thereof. The first through-hole conductors 6a are provided so as to facilitate heat propagation to the external electric circuit board 7. The thermal conductivity of the first through-hole conductors 6a is preferably more than five times as large as the thermal conductivity of the dielectric substrate 2, and it is more preferred that the first through-hole conductors 6a have a thermal conductivity of 100 W/m·K or more. In addition, preferably the diameter of the narrowest part of the first through-hole conductors 6a is from 0.1 to 0.5 mm. Meanwhile, the cross-cross-sectional profiles of these through-hole conductors 6a are not necessarily circular, but may be of an elliptic or slit-like (rectangular) shape.

The first through-hole conductors 6a are brazed onto a thermal dissipation conductor 15 on the upper surface of the external electric circuit board 7 through a brazing material 13. By this arrangement, heat radiated by the power amplifier device 4 is efficiently propagated through the first through-hole conductors 6a and the brazing material 13 to the thermal dissipation conductor 15 formed on the upper surface of the external electric circuit board 7, and thus it is possible to prevent the surface acoustic wave filter 8 in the module from being thermally influenced by the heat radiated by the power amplifier device 4.

Meanwhile, the surface acoustic wave filter 8 is mounted on the surface acoustic wave mounting portion 2b being electrically connected to the electrode part of a conductor layer 2b1 formed on the bottom surface of the surface acoustic wave mounting portion 2b through conductive bumps 3b. For the conductive bumps 3b, gold, solder, thermosetting Ag paste or the like may be used.

Since the structure of the filter device constituting the surface acoustic wave filter 8 is the same as described in the first embodiment, this will not be further explained.

While the surface acoustic wave filter mounting portion 2b of the embodiment in FIG. 8 is sealed by application of underfill resin 5 such as silicone resin or epoxy resin, the surface acoustic wave filter may be mounted on a recess and sealed with the underfill resin 5.

In addition, in the present invention, a second through-hole conductor 11 extending from the upper surface of the dielectric substrate 2 to the bottom surface thereof is formed between the aforementioned power amplifier device mounting portion 2a and the surface acoustic wave filter mounting portion 2b. In the same way as the first through-hole conductors 6a, this second through-hole conductor 11 is mounted onto the thermal dissipation conductor 15 on the upper surface of the external electric circuit board 7 through the brazing material 13.

By forming such a second through-hole conductor 11, a part of heat radiated by the power amplifier device 4 which is propagated from the power amplifier device mounting portion 2a to the underfill resin 5 and a part of the heat which is propagated to the dielectric layers 2 between the mounting portions 2a, 2b can be absorbed by the second through-hole conductor 11 and efficiently propagated to the thermal dissipation conductor 15 formed on the upper surface of the external electric circuit board 7.

Also, in the present invention, a conductor layer 2a1 is formed on the bottom surface of the power amplifier device mounting portion 2a and extends horizontally, and an extending portion thereof is connected to the second through-hole conductor 11. By this structure, the conductor layer 2a1 is able to absorb circumambient heat and transfer the heat to the second through-hole conductor 11, thereby allowing the heat to be efficiently dissipated to the thermal dissipation conductor 15 on the upper surface of the external electric circuit board 7.

Additionally, according to the invention, it is preferred that a third through-hole conductor 23 is provided under the filter device mounting portion 2b. This third through-hole conductor 23 is also formed so that it extends to the lower surface of the dielectric substrate 2 and is attached to the thermal dissipation conductor 15 on the upper surface of the external electric circuit board 7 through the brazing material 13 in the same way as the first through-hole conductors 6a and the second through-hole conductor 11. By providing this third through-hole conductor, temperature rise in the surface acoustic wave filter 8 itself can be suppressed.

The aforementioned effect can be further enhanced by providing, instead of only one, two or more such second through-hole conductors 11 between the power amplifier device mounting portion 2a and the surface acoustic wave filter mounting portion 2b.

Figure 9:
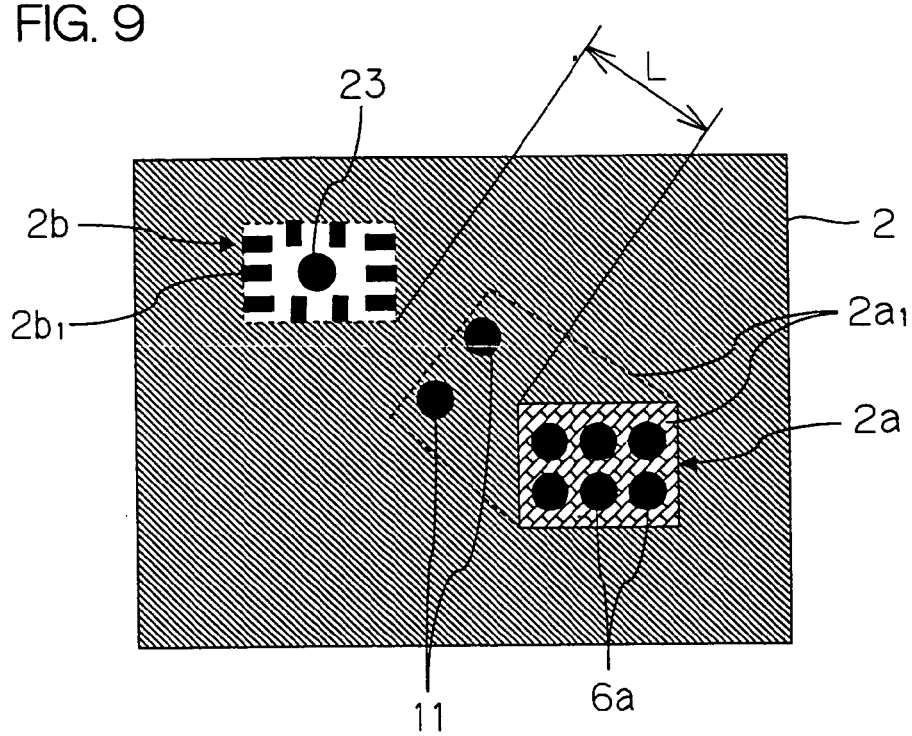
FIG. 9 is a schematic plan view showing an example of the arrangement of through-hole conductors in a high frequency module according to the present invention.
Figure 10:
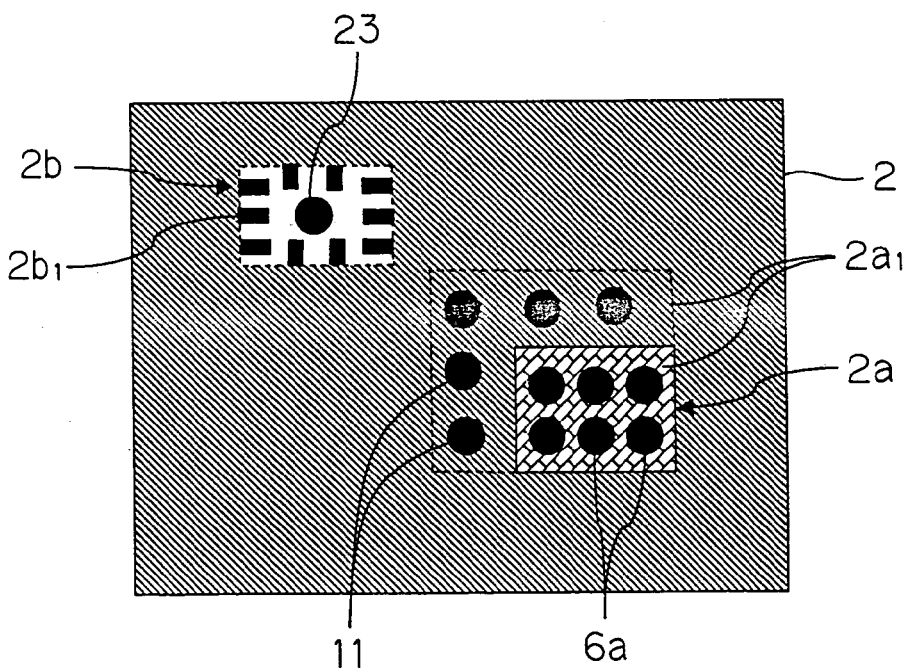
FIG. 10 is a schematic plan view showing another example of the arrangement of through-hole conductors in a high frequency module according to the present invention.
Figure 11:
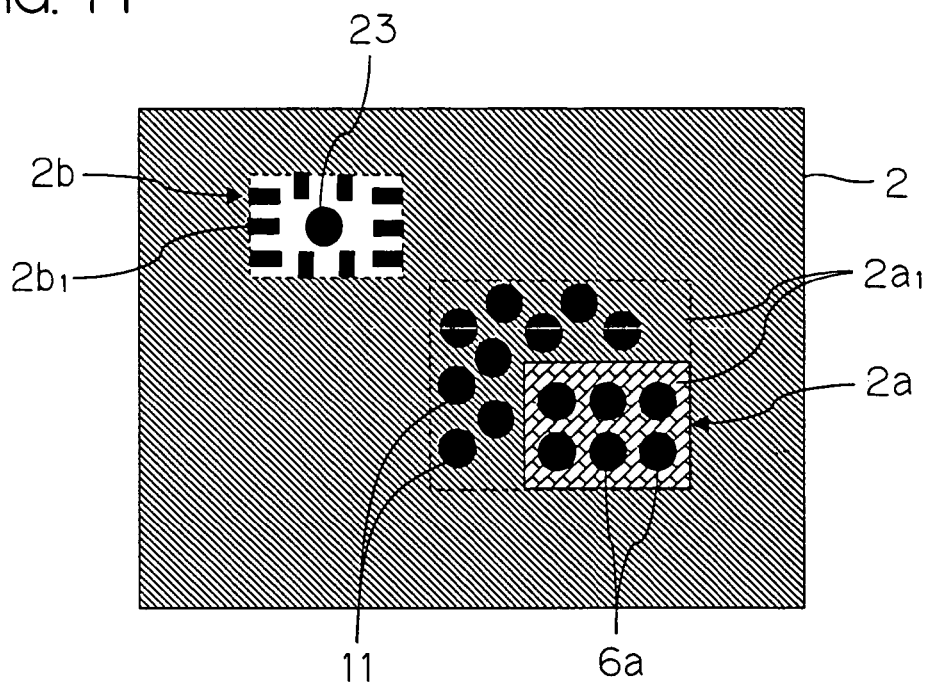
FIG. 11 is a schematic plan view showing still another example of the arrangement of through-hole conductors in a high frequency module according to the present invention.

Specific examples in which a plurality of such second through-hole conductors 11 are provided are shown in FIGS. 9–11. FIG. 9 is a plan view showing the high frequency module of FIG. 8 viewed from the top, in which the surface acoustic wave filter and the power amplifier device are not diagramed. FIGS. 10 and 11 are plan views showing other examples.

In the example of FIG. 9, two second through-hole conductors 11 are disposed at an approximate middle area between the power amplifier device mounting portion 2a and the surface acoustic wave mounting portion 2b which are arranged diagonally when viewed two-dimensionally. In FIG. 10, a plurality of second through-hole conductors 11 are disposed at an approximate middle area between the power amplifier device mounting portion 2a and the surface acoustic wave filter mounting portion 2b in a L-shape arrangement partially enclosing the power amplifier device mounting portion 2a. FIG. 11 illustrates an example in which a plurality of second through-hole conductors 11 are disposed at the approximate middle area in a zigzag arrangement partially enclosing the power amplifier device mounting portion 2a.

It is preferred that the power amplifier device mounting portion 2a and the surface acoustic wave filter mounting portion 2b are spaced apart at a distance of 0.8 mm or more, or more preferably, 1.0 mm or more. This makes it possible to sufficiently reduce the heat propagation from the power amplifier device 4 to the surface acoustic wave filter 8 through the dielectric layers 2 between the mounting portions 2a, 2b. Incidentally, the "distance between the power amplifier device mounting portion 2a and the surface acoustic wave filter mounting portion 2b" refers to the shortest distance between the mounted power amplifier device 4 and the surface acoustic wave filter 8 when viewed two-dimensionally. For example, it is indicated by "L" in FIG. 9.

In order that the first, second and third through-hole conductors 6a, 11, 23 according to the present invention exert their functions, they are preferably formed of metal with superior thermal conductivity, in particular, it is preferred that the through-hole conductors each comprise a conductor which is mainly composed of metal, comprising at least one material selected from the group consisting of Cu, CuO, Ag, Ag—Pd, Ag—Pt and Au. Above all, in order to make it harder for heat radiated by the power amplifier device 4 to be propagated through the dielectric substrate 2 to the surface acoustic wave filter 8, preferably, at least the thermal conductivity of the second through-hole conductor 11 is more than five times as large as the thermal conductivity of the dielectric substrate 2, and more preferably, it is 100 W/m·K or more. Additionally, these through-hole conductors 6a, 11, 23 are preferably formed by cofiring with the dielectric substrate 2. For this purpose, they may include inorganic materials such as metal oxide and glass so as to afford control of the shrinkage or the like upon firing with the dielectric substrate.

Such a high thermal conductivity of the through-hole conductor can be realized, for example, as a thermal conductivity of about 130 W/m·K or more, by mixing 80–90% by mass of Ag powder, 1–46 by mass of lead borosilicate glass, and 5–15% by mass of $SiO_2$.

It is preferred that the diameter of the narrowest part of each of the through-hole conductors Ga, 11, and 23 is from 0.1 to 0.5 mm. When a plurality of through-hole conductors are formed, the through-hole conductors are disposed such that the lateral surfaces of adjacent through-hole conductors are spaced at intervals of 0.2–1.0 mm, by which the heat conduction efficiency achieved by the plural number of through-hole conductors can be enhanced, while cracking in dielectric layers among the through-hole conductors is prevented from occurring. In addition, the cross-cross-sectional profiles of the through-hole conductors 6a, 11, 23 are not necessarily circular, but may be of an elliptic or slit-like (rectangular) shape.

In the high frequency module according to the present invention, as shown in FIG. 8, the power amplifier device mounting portion 2a and the surface acoustic wave filter mounting portion 2b are each formed by providing a recess and the like at a different depth so that the conductor layers 2a1 and 2b1, which are formed in the dielectric substrate 2 being disposed at the bottom surface of the power amplifier device mounting portion 2a and the bottom surface of the surface acoustic wave filter mounting portion 2b, respectively, are each formed on a different dielectric layer. Thus, the quantity of heat that is propagated from the power amplifier device 4 to the surface acoustic wave filter 8 through the dielectric layers and conductor layers can be more effectively reduced as compared with cases where such conductive layers 2a1 and 2b1 are formed on the same dielectric layer. Accordingly, it is possible to ensure that the electric properties are prevented from deteriorating as a result of the thermal influence on the surface acoustic wave filter.

In the high frequency module 1 according to the present invention, electronic components 12 including resistor, capacitor, inductor, semiconductor device, MEMS (Micro Electro Mechanical Systems) are mounted on the upper surface of the dielectric substrate 2. An inner conductor wiring 16, a surface conductor wiring 17 and a via-hole conductor 18 are formed on the surface of or inside the dielectric substrate 2 so as to electrically connect the electronic components 12 to the power amplifier device 4 and the surface acoustic wave filter 8, thereby constructing a desired electronic circuit. Also according to the need, when a high frequency filter (not shown) or the like comprising capacitor, inductor and the like is incorporated within the dielectric substrate 2 by utilizing conductor wiring, a further down-sized high frequency module 1 with further improved functions can be realized.

In addition, by mounting a metal shield case 14 over the module for the purpose of protecting the electronic components 12 and electronic circuits mounted on the surface of the high frequency module 1, it is possible to shield or suppress mechanical stress from the outside, atmospheric influences, and electromagnetic noises.

Furthermore, by including components such as a varistor and a chip inductor in the electronic components 12 on the surface of the high frequency module 1, or incorporating an inductor within the dielectric substrate 2, a high frequency module 1 protected against static electricity can be realized.

In this high frequency module 1, electrode pads 20 for signal transmission formed in the high frequency module are connected to the signal wiring layer 21 formed on the upper surface of the external electric circuit board 7 through the brazing material 13.

Figure 12:
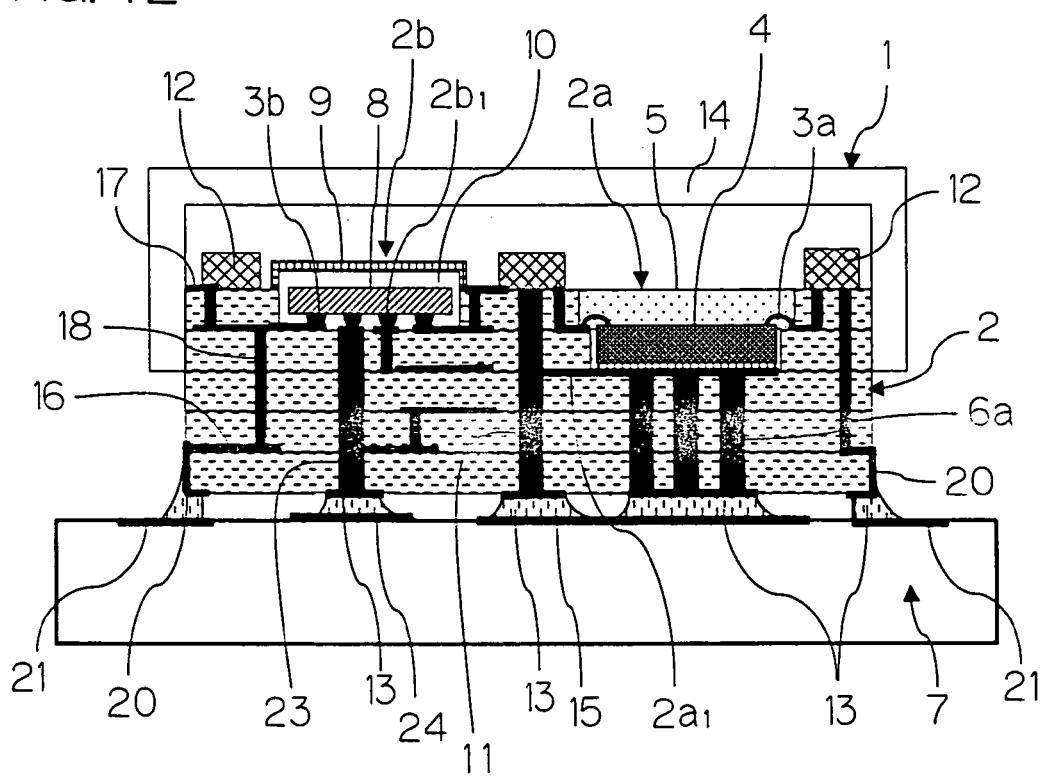
FIG. 12 is a schematic cross-sectional view showing another high frequency module according the second embodiment of the present invention.

FIG. 12 is a cross-sectional view of still another high frequency module according to the invention. While the surface acoustic wave filter mounting portion 2b is provided on the upper surface of the dielectric substrate 2 in the embodiment of FIG. 8, in this embodiment of FIG. 12, a surface acoustic wave filter mounting portion 2b is disposed at a conductor layer 2b1 formed on the bottom surface of a recess in a dielectric substrate 2. It is also possible to connect the surface acoustic wave filter 8 to a signal rail by wire bonding.

In the high frequency module of FIG. 12, a cover component 9 is attached to the surface acoustic wave filter mounting portion 2b in the form of a recess being spaced apart from the surface acoustic wave filter 8. For the purposes of mechanically protecting the surface acoustic wave filter 8 and suppressing deterioration of the IDT electrode due to oxidization, air with low humidity or the like is encapsulated within the inner space, which is the vibration space, of the surface acoustic wave filter mounting portion 2b. The cover component 9 is a component for air-tightly sealing the surface acoustic wave filter 8 and is attached to the dielectric substrate 2 by means of an epoxy resin, brazing material or the like. Incidentally, instead of the air, an inert gas such as nitrogen gas or argon gas, or an inert gas with lower thermal conductivity than that of air may be encapsulated, by which deterioration of the IDT electrode due to oxidization can also be prevented.

The material used for the cover component 9 may be a metal such as SUS, copper, nickel silver or the like, or a resin such as glass epoxy resin or the like.

Also, in the embodiment of FIG. 12, a through-hole conductor 11 is disposed at an approximate middle area between the power amplifier device mounting portion 2a and the surface acoustic wave filter mounting portion 2b as in FIG. 8. Here, one end of the through-hole conductor 11 is exposed at the lower surface of the module 1 and brazed onto a thermal dissipation conductor 15 through a brazing material 13, while another end thereof is connected to an extending portion of a conductor layer 2a1. This end may be extended further upward.

Figure 13:
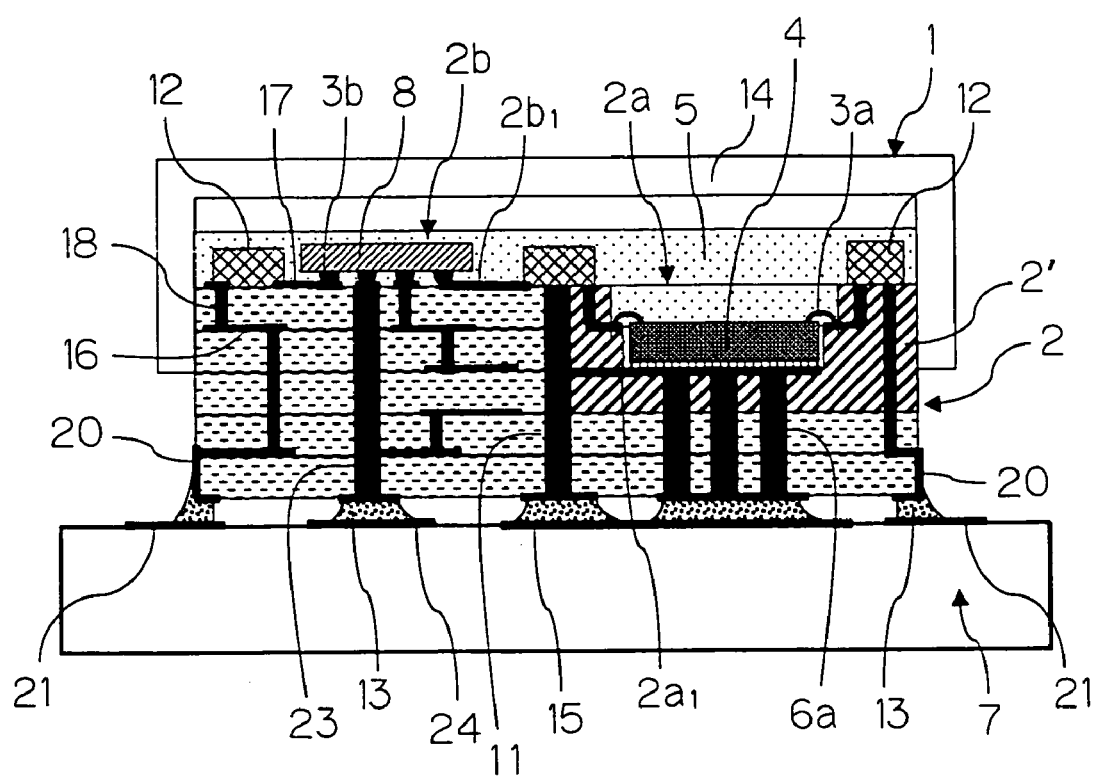
FIG. 13 is a schematic cross-sectional view showing still another high frequency module according the second embodiment of the present invention.

FIG. 13 is a schematic cross-sectional view illustrating yet another high frequency module according to the invention. While the dielectric substrate 2 is formed uniformly of the same material in the embodiments of FIGS. 8 and 12, in the embodiment of FIG. 13, a portion located around a power amplifier device mounting portion 2a is formed of a dielectric material 2' which has a lower thermal conductivity than the other portion of the dielectric substrate 2. By this feature, the dielectric material 2' functions as a heat insulator, and thereby heat radiated by the power amplifier device 4 can be prevented from being diffused or propagated around the device.

The above said high frequency module according to the present invention can be fabricated by the process described below. An example where the dielectric substrate is composed of a low-temperature-fireable composition such as a glass-ceramic composition is discussed below as a preferred embodiment.

First, to form dielectric layers constituting the dielectric substrate 2, ceramic green sheets composed of a glass-ceramic composition are fabricated as follows: 30–90% by mass of a glass such as borosilicate glass, zinc borosilicate-based glass, or $SiO_2$—$Al_2O_3$-alkaline earth oxide glass is mixed with 10–70% by mass of an inorganic filler such as alumina, quartz, mullite, AlN, or forsterite. Then, an organic binder such as alkyl methacrylate, a plasticizer such as DBP (dibutyl phthalate) and an organic solvent such as toluene are added to the mixture. The whole mixture is kneaded together in a ball mill for 4–8 hours to produce a slurry. By using the slurry, tape casting is performed by the doctor blade method or the like to produce a tape, and the tape is cut into sheets with a desired size, thereby fabricating ceramic green sheets.

Subsequently, the ceramic green sheets are formed with the through-hole conductors including the through-hole conductors 11 and the via-hole conductor 18 for connecting the inner conductor wiring 16 with the surface conductor wiring 17, recesses for mounting the power amplifier device and the surface acoustic wave filter, and through-holes for the through-hole conductors. In carrying out this process, recesses and through-holes with various shapes such as circular, elliptic, and elongated shapes are formed by micro drilling and/or punching, and additionally, by subjecting green sheets containing photosensitive resin to an exposure and development process.

The through-holes for through-hole conductors 11 and the through-hole for the via-hole conductor 18 are filled with a Cu or Ag-based conductive paste, and simultaneously, the green sheets are each formed with patterns that are to serve as the inner conductor wiring 16, the surface conductor wiring 17, the conductor layer 2a1 and the conductor layer 2b1, using Cu or Ag-based paste by screen printing or gravure printing.

For the Cu or Ag-based paste, in addition to powders such as Cu powder, CuO powder and Ag powder, Ag alloy powders such as Ag—Pd powder and Ag—Pt powder may be employed. According to the need, predetermined amounts of a borosilicate-based loW/melting-point glass, $SiO_2$, $Al_2O_3$, an alkaline earth metal oxide such as MgO or CaO, a metal oxide such as $Bi_2O_3$ are mixed with the metal powder, and an organic binder such as ethyl cellulose and an organic solvent such as 2,2,4-trimethyl-1,3-pentanediol monoisobutyrate are further mixed therewith and homogeneously kneaded together to be used as the material.

When, according to the need, predetermined amounts of a borosilicate-based loW/melting-point glass such as zinc borosilicate glass, or lead borosilicate glass, inorganic materials such as metal oxide, for example, $Al_2O_3$, MgO, CaO, or $Bi_2O_3$, an organic binder such as ethyl cellulose and an organic solvent such as 2,2,4-trimethyl-1,3-pentanediol monoisobutyrate are mixed with the metal powder and homogeneously kneaded together to be used as the material, the thermal conductivity can be controlled by the ratio of the loW/melting-point glass and metal oxide to the metal powder.

The ceramic green sheets obtained in the above described manner are positioned, for example, by using the via-hole conductor 18 as the reference, stacked according to a lamination sequence and laminated together under heat and pressure, thereby an unfired multilayer body is produced.

Subsequently, this unfired multilayer body is fired, for example, in an oxidizing atmosphere so as to be sinter-bonded_together. Specifically, such a sintered substrate can be obtained by firing the multilayer body in an oxidizing atmosphere or in atmospheric air at a temperature of 800–1000.degree. C.

Thereafter, the power amplifier device 4, the surface acoustic wave filter 8 or the like are mounted on the mounting portion 2a, 2b, and then sealed by attaching the cover component 9 to the mounting portions by brazing or by injection of the organic resin sealant 19.

When such a module is mounted on the external electric circuit board 7, it is attached to the external electric circuit board by brazing the electrode pads 20 for signal transmission in the module, and simultaneously, by brazing the first through-hole conductors 6a, second through-hole conductor 11, and third through-hole conductor 23 onto the thermal dissipation conductor 15 formed on the upper surface of the external electric circuit board 7.

When the portion located around the power amplifier device mounting portion 2a is formed by employing the heat insulative dielectric material 2'as in FIG. 13, the process may be such that a photosensitive resin is mixed with a usual material for the dielectric substrate, and after a prescribed recess is formed by exposure and development, the heat insulative dielectric material 2' is injected into the recess, and punching or the like is further performed to form the recess, thereby fabricating an unfired multilayer body, which is then fired.

EXAMPLE

The present invention is hereinafter described in detail on the basis of the following example and comparative example.

A glass-ceramic-based dielectric material comprising a borosilicate glass and alumina and having a thermal conductivity of 3–5 W/m K was used as the dielectric material. For the through-hole conductors, an Ag-based conductive material with a thermal conductivity of 150 W/m·K was used. A high frequency module was fabricated as previously described. This high frequency module was mounted using a Cu—Ag-based brazing material onto the surface of a motherboard having an insulating substrate that was composed of a glass woven cloth-epoxy resin composite material and having a thermal dissipation conductor and a signal wiring layer made of copper formed thereon.

The conditions were set up so that with the source ON/OFF ratio (Duty cycle) of the power amplifier device (PA) being ⅛, an output of 33.5 dBm be obtained from an input signal of 0 dB, and the steady temperatures inside the power amplifier device mounting portion and the surface acoustic wave filter mounting portion were measured.

In addition, by using a simulation program for thermal conduction analysis, temperatures at the recesses were calculated for the case where the thermal conductivity of dielectric layers located around the power amplifier device was differed from that of the other portion (Sample No. 9).

Furthermore, it has been found that similar results were obtained in the case where the dielectric substrate was formed using two kinds of dielectric materials.

The forgoing embodiments are only illustrative of some preferred embodiments of the present invention, and should not be construed as limiting the scope of the invention. It will, however, be evident that various modifications and changes may be made thereto without departing from the spirit and scope of the invention.

What is claimed is:

1. A high frequency module comprising:
    a dielectric substrate comprising a plurality of dielectric layers that are laminated together;
    a power amplifier device mounted on a recess for mounting power amplifier device that is formed on a first surface of the dielectric substrate;
    a filter component mounted on a recess for mounting filter component formed on the first surface or a second surface of the dielectric substrate;
    a conductor layer that is formed on one dielectric layer in the dielectric substrate and electrically connected to the power amplifier device;
    a thermal transfer seal component attached in contact with the power amplifier device; and
    a through-hole conductor whose one end is exposed at the first surface of the dielectric substrate and which is provided between the recess for mounting power amplifier device and the recess for mounting filter component,
  wherein the thermal transfer seal component and the through-hole conductor are connected to a thermal dissipa-

TABLE 2

| Sample No. | Module structure | Thermal conductivity of dielectric substrate (W/m · K) | Space between mounting portions (mm) | Number of second through-hole conductors | Temperature at PA mounting portion (° C.) | Temperature at SAW/mounting portion (° C.) |
|---|---|---|---|---|---|---|
| *1 | — | 5 | 0.5 | 0 | 95 | 80 |
| *2 | — | 5 | 0.8 | 0 | 90 | 75 |
| 3 | FIG. 8 | 5 | 0.8 | 2 | 87 | 59 |
| 4 | FIG. 8 | 3 | 1.2 | 2 | 81 | 47 |
| 5 | FIG. 12 | 3 | 0.8 | 5 | 84 | 55 |
| 6 | FIG. 12 | 3 | 0.8 | 9 | 81 | 49 |
| 7 | FIG. 12 | 3 | 0.8 | 2 | 83 | 45 |
| 8 | FIG. 12 | 5 | 0.8 | 2 | 87 | 57 |
| 9 | FIG. 13 | 5 (3 around PA) | 0.8 | 2 | 80 | 55 |

*Not within the invention

As is apparent from the results in Table 2, in the samples (Nos. 3–9) having the structure of the present invention in which the first through-hole conductor and second conductor are provided, heat radiated by the power amplifier device can be effectively dissipated and the thermal influence on the surface acoustic wave filter can be reduced.

It has been also understood that in the structure of the present invention, the effect is more remarkable as the number of the second through-hole conductors increases and the thermal conductivity of the dielectric substrate decreases.

tion conductor on an upper surface of an external electric circuit board through a brazing material.

2. The high frequency module according to claim 1, wherein the conductor layer is formed on a bottom surface of the recess for mounting power amplifier device.

3. The high frequency module according to claim 1, wherein the thermal conductivity of the dielectric layers is 20 W/m·K or less.

4. The high frequency module according to claim 1, wherein a portion of the dielectric layers that is located around the recess for mounting power amplifier device comprises a dielectric layer having a thermal conductivity smaller than the thermal conductivity of a portion of the dielectric layers that is located around the recess for mounting filter component.

5. The high frequency module according to claim 1, wherein the recess for mounting power amplifier device and the recess for mounting filter component are spaced apart at a distance of 0.3 mm or more.

6. The high frequency module according to claim 1, wherein the thermal conductivity of the through-hole conductor is 100 W/m·K or more.

7. The high frequency module according to claim 1, wherein there are a plurality of the through-hole conductors formed between the recess for mounting power amplifier device and the recess for mounting filter component.

8. The high frequency module according to claim 1, further comprising a second conductor layer which is formed on one dielectric layer in the dielectric substrate and electrically connected to the filter component, wherein the second conductor layer and the conductor layer that is electrically connected to the power amplifier device are each formed on a different dielectric layer.

9. The high frequency module according to claim 8, wherein the second conductor layer is formed on a bottom surface of the recess for mounting filter component.

10. The high frequency module according to claim 1, wherein the recess for mounting filter component is sealed with a cover component.

11. The high frequency module according to claim 1, wherein the recess for mounting filter component is filled with an insulative resin.

12. The high frequency module according to claim 1, wherein the filter component is one of the group consisting of a surface acoustic wave filter SAW, a film bulk acoustic resonator FBAR, and a bulk acoustic wave filter BAW.

* * * * *